United States Patent [19]

Leyden et al.

[11] Patent Number: 4,639,290

[45] Date of Patent: Jan. 27, 1987

[54] METHODS FOR SELECTIVELY REMOVING ADHESIVES FROM POLYIMIDE SUBSTRATES

[75] Inventors: Richard N. Leyden, Topanga; Robert Lawrence, Malibu, both of Calif.

[73] Assignee: Hughes Aircraft Company, Los Angeles, Calif.

[21] Appl. No.: 806,874

[22] Filed: Dec. 9, 1985

[51] Int. Cl.$^4$ .............. B44C 1/22; B29C 17/08; C03C 15/00; C23F 1/02

[52] U.S. Cl. .................. 156/644; 134/22.1; 134/22.17; 156/630; 156/652; 156/655; 156/668; 156/902; 252/79.5; 427/97

[58] Field of Search .............. 156/630, 633, 634, 644, 156/645, 650–652, 655, 656, 659.1, 668, 643, 646, 344, 902; 427/97; 134/22.1, 22.17, 1; 252/79.1, 79.2, 79.5; 264/139, 344

[56] References Cited

U.S. PATENT DOCUMENTS

| | | | |
|---|---|---|---|
| 3,868,720 | 2/1975 | New et al. | 357/34 |
| 4,078,096 | 3/1978 | Redmond et al. | 427/98 |
| 4,112,139 | 9/1978 | Shirk et al. | 427/54 |
| 4,346,125 | 8/1982 | Kinshian et al. | 427/96 |
| 4,426,253 | 1/1984 | Kreug et al. | 156/668 |

OTHER PUBLICATIONS

"A Novel Polyimide Film Preparation & its Preferential-Like Chemical Etching Techniques for GaAs Devices" Journal Electro-Chemical Society, vol. 130, pp. 129–134, (1983).

Primary Examiner—William A. Powell
Attorney, Agent, or Firm—M. E. Lachman; A. W. Karambelas

[57] ABSTRACT

Methods for forming holes of predetermined size in polyimide substrates having metallic layers adhesively attached thereto include selectively removing areas of desired size and shape from the metallic layer; contacting the exposed adhesive layer with a selective etchant therefor that does not affect the polyimide substrate or undercut the adhesive near the opening formed; and selectively etching the polyimide substrate exposed in the openings by removal of the adhesive layer overlying the polyimides. These methods permit rapid, efficient formation of holes having a diameter as small as one mil (0.00254 cm).

14 Claims, No Drawings

METHODS FOR SELECTIVELY REMOVING ADHESIVES FROM POLYIMIDE SUBSTRATES

This invention relates to methods for forming holes in polyimide substrates having metallic layers adhesively attached thereto. The invention also relates to methods for selectively removing certain polymeric acrylic adhesives from the surface of polyimide substrates without damaging the substrates.

The methods of this invention comprise forming at least one hole of predetermined size in a polyimide substrate having thereon a metallic layer and an adhesive layer linking the polyimide substrate to the metallic layer. The adhesive is a cross-linked acrylic polymer such as an acrylic copolymer cross-linked with a phenol. Such an adhesive is du Pont's Pyralux, a lightly cross-linked acrylic copolymer.

These methods comprise forming at least one opening in the metallic layer to expose the underlying portion of the adhesive layer, and then contacting the exposed adhesive layer in the openings with a medium selective for loosening the adhesive layer, for a time and at a temperature sufficient to loosen the exposed adhesive layer from the holes, but insufficient to undercut the adhesive anywhere else on the substrate, and insufficient to damage substantially the polyimide substrate. After this contacting step, these methods preferably comprise contacting the exposed adhesive with an adhesive-fragmenting medium such as water to fragment and remove the exposed adhesive. Thereafter, these methods call for contacting the exposed, adhesive-free polyimide substrate in the holes with an etchant for selectively removing the polyimide substrate from the openings. The selective polyimide etchant should be substantially non-reactive with the adhesive layer.

The invention also relates to methods for removing adhesives of the kind described, such as du Pont's Pyralux, from predetermined areas of precise size and shape on the surface of polyimides comprising contacting these adhesive areas with selective agents that are substantially non-reactive with the polyimide, under the conditions of contacting, at temperatures and for times sufficient to selectively remove the adhesive layer from the predetermined areas. These methods are particularly effective where the adhesive to be removed has one or more layers atop the adhesive and adjacent the adhesive to be removed that must remain substantially intact.

The selective adhesive removing medium is preferably an alkaline solution, most preferably an alkaline glycol solution, having a pH in the range of about 13 to about 14 and including one or more glycols such as ethylene glycol. The preferred material for making this solution alkaline is sodium hydroxide, but potassium hydroxide or other hydroxides can be used. Such alkaline glycol solutions are particularly effective when applied at a temperature in the range of about 120° C. to about 145° C. and for a time sufficient to remove the adhesive as desired. Preferred times are in the range of about 30 to about 180 seconds at these temperatures, where the adhesive is attached to a polyimide substrate such as Kapton.

After the selective loosening of the adhesive layer on the polyimide substrate, the adhesive residues are removed, most preferably by washing with water for a time in the range of about 1 to about 5 minutes, and drying at a temperature of about 100° C. to about 120° C. for a time in the range of about 5 to about 10 minutes. Such rinse limits adhesive removal to the desired areas of predetermined size and shape.

The selective polyimide etchant is preferably hydrazine hydrate dissolved in a diamine such as ethylene diamine. The ratio of the hydrate to the diamine should be in the range of about 2 to about 8 parts by volume. The polyimide etchant preferably contacts the polyimide for a time in the range of about 7 to about 10 minutes where the contacting temperature is in the range of about 32° C. to about 38° C.

After the polyimide substrate is selectively removed, the polyimide etchant should also be removed, as by rinsing with water or other solvent for a time in the range of about 1 to about 5 minutes and at a temperature in the range of about 20° C. to about 30° C.

Where the polyimide substrate carries both an adhesive layer and, over the adhesive layer, a metallic layer such as copper cladding, the methods of this invention comprise first forming at least one opening of predetermined size and shape in the metallic layer. For copper cladding on polyimide substrates, such openings are preferably formed by masking with photoresist and etching with a suitable etchant such as ferric chloride.

Preferably, after forming holes of predetermined size and shape in the polyimide substrate, and in the adhesive and metallic layers thereon, the holes are honed to remove any uneven or jagged surfaces by such processes as plasma etching or liquid honing. Liquid honing preferably comprises passing abradant slurries through the holes at speeds and at temperatures sufficient to remove uneven edges from the holes. Preferably, the liquid honing agent is micron-sized alumina slurry in water directed through the holes at a measured pressure for a measured time.

The methods of this invention are effective in forming holes in copper-clad polyimide cables having a Pyralux adhesive layer joining the copper cladding to the polyimide, particularly where the ratio of the thickness of the copper-clad polyimide to the diameter of the holes to be formed is in the range of less than 0.5 to about 1, and where the holes are not less than about 1 mil (0.00254 cm) in diameter.

These methods permit forming both so-called blind holes and so-called through holes in copper-clad or other metal-clad polyimide products such as cables. A blind hole passes once through the metal cladding, the adhesive layer, and the underlying polyimide layer, but does not pass again through the metal cladding on the side of the product directly opposite the opening formed in the metal cladding. A through hole passes entirely through the product, meaning that the hole passes through a first opening in the metal cladding on one side of the product, through the adhesive layer beneath that opening, through the polyimide layer beneath that opening, through the adhesive layer on the other side of the polyimide layer, and through the metal layers in registration with (i.e., directly opposite to) the first opening in the cladding.

EXAMPLE 1

We formed a one inch by one inch array (2.54 cm by 2.54 cm) of openings measuring 0.010 inch (0.025 cm) in diameter on 0.020 inch (0.05 cm) centers by etching the 0.0014 inch (0.0036 cm) thick copper layer on copper-clad polyimide, namely du Pont's Kapton polyimide. The polyimide layer itself had a thickness of 0.002 inch (0.05 cm). This copper-clad polyimide had a 0.001 inch (0.025 cm) thick layer of acrylic adhesive, namely du Pont's Pyralux adhesive, on each side of the Kapton to bond the copper cladding thereto. We applied ferric chloride to the product to etch the copper cladding through a photoresist mask on the surface of the cladding.

We prepared an alkaline ethylene glycol solution by dissolving 100 grams of sodium hydroxide in enough water to make 130 mls. We then diluted the sodium hydroxide aqueous solution with 300 mls of ethylene glycol.

We immersed the sample with the pattern of openings etched into the copper layer in the alkaline ethylene glycol bath for 30 seconds at 125° C. Thereafter, we removed the sample from the solution, soaked it in water for five minutes, and dried the sample for one hour at 100° C. We examined the sample to verify that the adhesive had been removed as desired.

We then etched the exposed polyimide in each of the openings with a hydrazine etch bath comprising a mixture of 200 milliliters of hydrazine hydrate, and 800 milliliters of ethylene diamine.

We then dried the etched test patterns for seven minutes at 35° C., and rinsed them with water. We honed each of the holes by a liquid honing technique to smooth the jagged edges along the holes.

Thereafter, we treated each of the holes with electroless copper, and plated them to the desired thickness. Microphotographs of cross-sections of these hole patterns showed acceptably plated holes through the polyimide substrates.

EXAMPLE 2

Following the steps of Example 1, we prepared a one inch by one inch array of holes on a sample measuring 0.004 inch (0.01 cm) in diameter on 0.010 inch (0.025 cm) centers. The only difference from the method of Example 1 was that the hydrazine bath etch time was 11 minutes, and we agitated this etchant throughout this time. Again, we obtained satisfactory through holes in the sample.

What is claimed is:

1. A method for forming holes of predetermined size in a polyimide substrate having thereon a metallic layer and an adhesive layer linking said polyimide substrate to said metallic layer, said adhesive including a cross-linked acrylic polymer, comprising:
   (a) forming at least one opening in said metallic layer, exposing a portion of said adhesive layer;
   (b) contacting the portion of said adhesive layer exposed in said at least one opening with an alkaline glycol solution at a temperature in the range of about 120° C. to about 145° C., and for a time sufficient to loosen said exposed portion of said adhesive layer, and then removing said exposed portion of said adhesive layer by contacting said exposed portion with an adhesive-removing medium; and
   (c) contacting the portion of said polyimide substrate exposed by the removal of said portion of said adhesive layer, with an etchant for selectively removing exposed polyimide substrate from said at least one opening, said etchant being substantially non-reactive with said adhesive layer under the conditions of said contacting.

2. A method for forming at least one hole of predetermined size in a polyimide substrate having thereon an adhesive layer comprising a cross-linked acrylic polymer including:
   (a) forming at least one opening of said predetermined size in said adhesive layer by contacting a predetermined portion of said adhesive layer with a selective medium for said adhesive at a temperature in the range of about 120° C. to about 145° C., and for a time sufficient to loosen the predetermined portion of said adhesive, and then removing said predetermined portion of said adhesive layer by contacting said predetermined portion with an adhesive-removing medium, said time being insufficient to cause any substantial removal of said adhesive layer beyond the edges of said at least one opening; and
   (b) contacting a predetermined portion of said polyimide substrate exposed by said at least one opening in said adhesive layer with an etchant for selectively removing said exposed polyimide substrate from said at least one opening, said etchant being substantially non-reactive with said adhesive layer under the conditions of said contacting.

3. The process of claim 1 wherein said etchant for selectively removing said polyimide substrate comprises hydrazine hydrate and a diamine.

4. The process of claim 3 wherein said diamine is ethylene diamine.

5. The process of claim 1 further comprising contacting said exposed adhesive layer in said at least one opening at a temperature of about 120° C. for a time in the range of about 30 to about 180 seconds.

6. The process of claim 1 wherein said holes of predetermied size are at least about one mil (0.00254 cm) in diameter.

7. The process of claim 1 wherein said polyimide is Kapton.

8. The process of claim 1 wherein said metallic layer comprises copper cladding.

9. The process of claim 1 wherein the ratio of the combined thicknesses of said polyimide substrate, said metallic layer and said adhesive layer, to the diameter of said at least one hole of predetermined size is in the range of less than 0.5 to about 1.

10. The process of claim 1 further comprising after said contacting with said etchant for selectively removing said polyimide, honing said at least one hole for a time sufficient to remove substantially all of the uneven edges from the surfaces thereof.

11. A method for removing adhesive material comprising a cross-linked acrylic polymer from an area of predetermined size on the surface of a polyimide substrate comprising contacting said area with a selective etchant for said adhesive comprising an alkaline glycol solution at a temperature in the range of about 120° C. to about 145° C., and for a time sufficient to loosen said area from said polyimide substrate without substantial damage to any other area on said surface, and then removing said exposed portion of said adhesive layer by contacting said exposed portion with an adhesive-removing medium.

12. The method of claim 1 wherein said polyimide substrate has a first said metallic layer and a first said adhesive layer on a first side of said substrate and a second said metallic layer and a second said adhesive layer on a second side of said substrate opposing said first side.

13. The method of claim 12 wherein at least one of said holes is a blind hole.

14. The method of claim 12 wherein at least one of said holes is a through hole, and wherein said through hole is made by forming in each of said first and second metallic layers at least one opening in registration with one another on opposing sides of said polyimide substrate, and wherein the portions of said first and second adhesive layers exposed in each of said openings, and the portions of said polyimide substrate between said openings, are removed.

* * * * *